United States Patent [19]

Schweitzer et al.

[11] Patent Number: 5,150,530
[45] Date of Patent: Sep. 29, 1992

[54] TOOL EXCHANGE SYSTEM FOR HYBRID DIE BONDER

[75] Inventors: Karl Schweitzer, Mitte; Gerhard Zeindl, Munster, both of Austria

[73] Assignee: Emhart, Inc., Newark, Del.

[21] Appl. No.: 661,888

[22] Filed: Feb. 27, 1991

[30] Foreign Application Priority Data

Mar. 16, 1990 [GB] United Kingdom ............... 9006037

[51] Int. Cl.⁵ .............................................. B23B 49/00
[52] U.S. Cl. ................................. 33/626; 33/DIG. 1; 33/645; 33/572
[58] Field of Search ................. 33/626, 644, 645, 572, 33/613, DIG. 1, 567

[56] References Cited

U.S. PATENT DOCUMENTS

| 2,976,613 | 3/1961 | Shields | 33/DIG. 1 X |
| 4,360,974 | 11/1982 | Cuissart | 33/645 |
| 4,390,172 | 6/1983 | Gotman | 33/613 |

Primary Examiner—Harry N. Haroian
Attorney, Agent, or Firm—Spencer T. Smith

[57] ABSTRACT

A hybrid die bonder has the ability to change tool holders to accommodate different die sizes. The single pick up head is selectively, magnetically, connectable to any of a plurality of tool holders. An electromagnet in the head holds a magnetic tool holder and a sealed air line is established therebetween. Prior to pick up, the head and tool holder have the same orientation so that precision locating structure therebetween will cooperate to establish a precise axis for the tool holder.

4 Claims, 2 Drawing Sheets

TOOL EXCHANGE SYSTEM FOR HYBRID DIE BONDER

BACKGROUND OF THE INVENTION

The present invention relates to a tool exchange system for a die pick-up stage of a hybrid die bonder, in particular an automatic hybrid die bonder.

A hybrid die bonder is used for bonding semiconductor dice of a range of different types, and in particular, sizes to a substrate. The die is supplied in an appropriate die presentation system, a number of different types of which are known and used, to a die eject station, at which individual dice are ejected from the die presentation system and picked up by an appropriate tool.

In known pick-up systems, the pick-up tool comprises one or more pairs of jaws held in a holder fixed in the machine. When it is necessary to change from picking up one size of die to picking up a different size of die, in known machines, the tool jaws are changed. This has the disadvantage that there is a loss in operating time while the jaws are being changed, and the exact position and orientation of the jaws relative to a fixed reference point has to be determined on each occasion that the jaws are changed.

It is a further disadvantage of the known machines, which is particularly significant when small dice are being handled, that the effective weight of the tool assembly is quite high, which makes fine adjustment of the die more difficult.

It is an object of the present invention to provide a tool exchange system for a die pick-up stage of a hybrid die bonder, in particular an automatic hybrid die bonder, in which the above disadvantages are reduced or substantially obviated.

BRIEF SUMMARY OF THE INVENTION

An automatic hybrid die bonder, as shown in FIG. 1, comprises a die presentation system, shown generally at 102, a die eject station shown generally at 104 and a die pick up and mounting system, which may be a die collect system (106) or an epoxy print system (108), according to the present invention. A suitable die presentation system (102) is described and claimed in our copending U.S. patent application Ser. No. 661,915, filed on Feb. 27, 1991, and comprises a magazine (110) for storing a plurality of die presentation packages (112), a rotatable clamp assembly (114) comprising front and second clamp means (116,118) mounted on a rotatable support and each adapted to collect a selected die presentation package from the magazine (110), feed it to the die eject station (104), retrieve it from the die eject station after a predetermined number of dice have been ejected and return it to said magazine (110). The die presentation system (102) further comprises indexing means for indexing movement of the packages with the magazine (110) so that the selected package is located at a collection point for collection from the magazine.

The die presentation package is then fed to a die eject station (104) which suitably comprises a die eject system such as the die eject system described and claimed in our copending U.S. patent application Ser. No. 661,916, filed on Feb. 27, 1991, which system comprises a support, a plurality of die eject leads mounted on the support, and means for indexing movement of the support to index a die eject head into an operative position. The different die eject heads comprise different arrangements of die eject needles, each of which is suitable for ejecting a particular size or type of die.

After ejection at the die eject station (104), the die os picked by a suitable pick up tool and taken to a die mounting station. An automatic hybrid die bonder preferably comprises both a die collet mounting station (106) and a epoxy die bonding station (108). The die pick-up stage suitably comprises a tool exchange system according to the present invention.

The present invention provides a tool exchange system for a hybrid die bonder, which system comprises
 (a) a support
 (b) a head mounted on the support
 (c) a tool bank comprising a plurality of tool holders each fitted with a tool, and adapted for pick-up by the head (b)
 (d) co-operating centering means on the tool holder and head (b) for precise positioning of the tool holder on the head
 (e) means for driving the head between the tool bank (b), a die eject station of the hybrid die bonder and a mounting station and (f) means for indexing the tool bank (b) to index a selected tool holder to a station at which it can be picked up by the head (b).

The tool bank (c) preferably contains a plurality of tool holders, each of which is fitted with a differently sized tool. The tool holders may be arranged in a linear bank or may be spaced, preferably equiangularly for rotation about an axis.

The tool holder is preferably held on the head (b) by means of an electromagnet.

BRIEF DESCRIPTION OF THE DRAWINGS

A preferred embodiment of a tool exchange system for a die pick-up stage of a hybrid die bonder according to the invention will now be described with reference to the accompanying drawings, in which.

DETAILED DESCRIPTION

Figure 1:
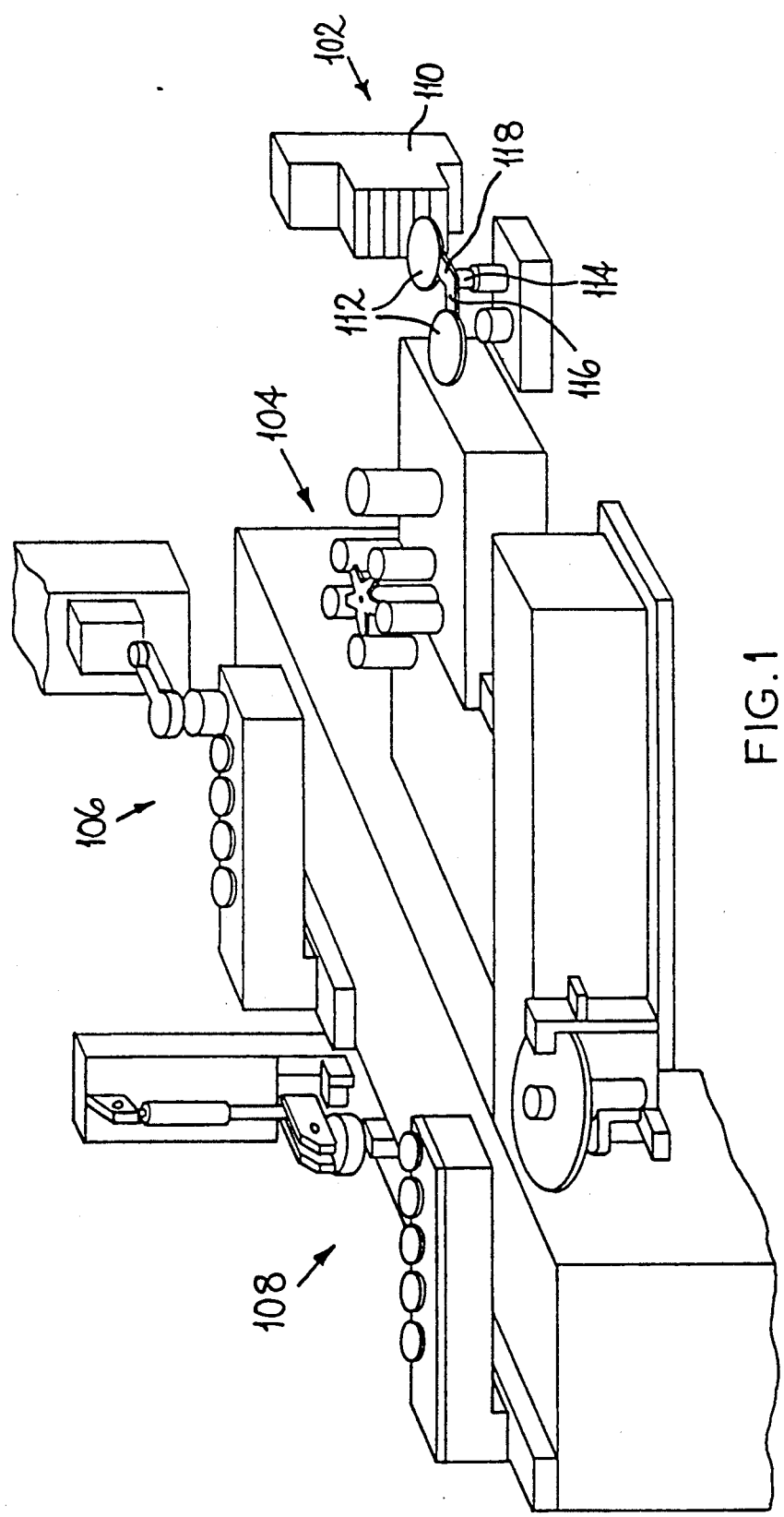
FIG. 1 is a general view of an automatic hybrid die bonding machine.
Figure 2:
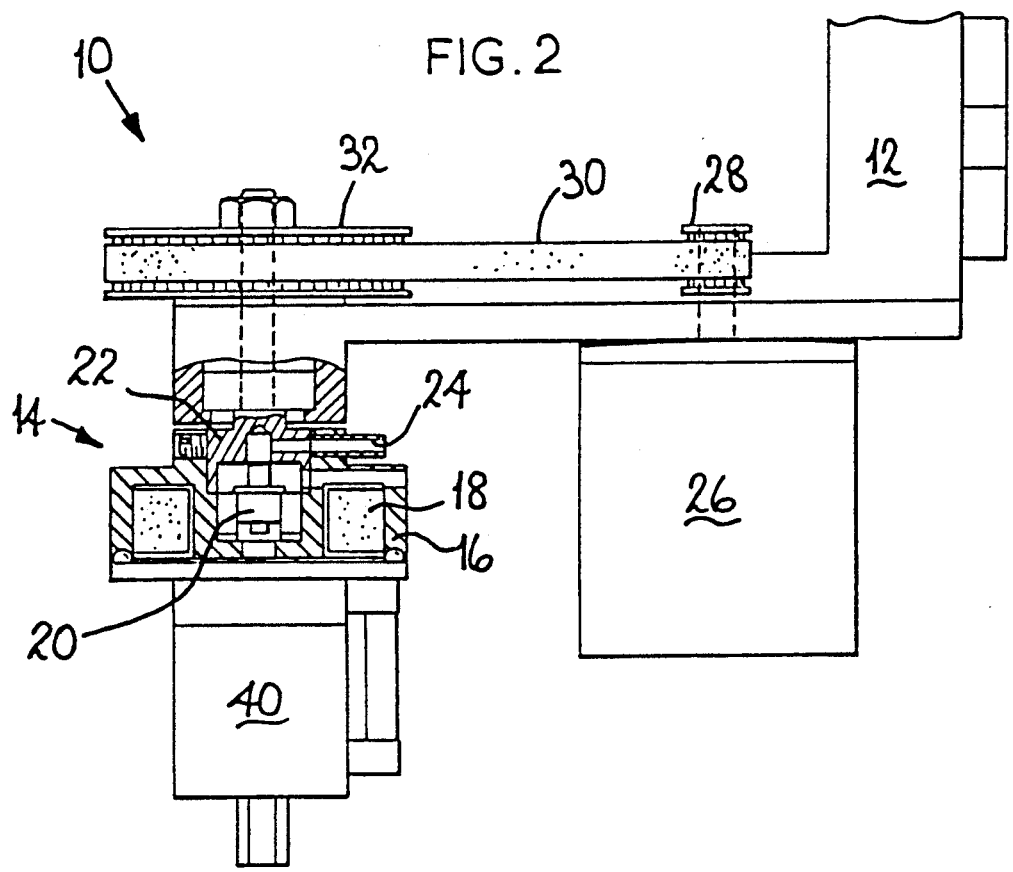
FIG. 2 is a view in section of a head assembly with tool holder fitted.

As can be seen from FIG. 2, a head assembly (10) is mounted on a support (12), and comprises a head (14) which comprises a magnet body (16) in which a solenoid (18) is located. A central bore of cross-section is provided in the head (14), and is in the form of an upper relatively narrow section, which is extended into an area of relatively large cross-section, before terminating in a relatively short, relatively narrow section at the lower part of the head. A photo cell (20) is located within the relatively large section of the bore. A spindle (22) of matching cross section with the bore is located within the upper, relatively narrow section, and extends, with its own relatively large extended portion, into the upper part of the relatively large section. The head (14) is secured to the spindle (22) which is mounted for rotation about a vertical axis. An air or vacuum connection (24) is provided in the head (14) above the solenoid (18) and communicates with the central bore.

A stepping motor (26) is mounted on the support (12), and connected through the support (12) to a first belt drive wheel (28). The first belt drive wheel (28) is connected via a toothed belt (30) to drive a second wheel (32). This second wheel (32) is adapted for driving engagement with the spindle (22) of the head (14). A switch (not shown) is provided to control the position of the spindle (22).

Figure 3:
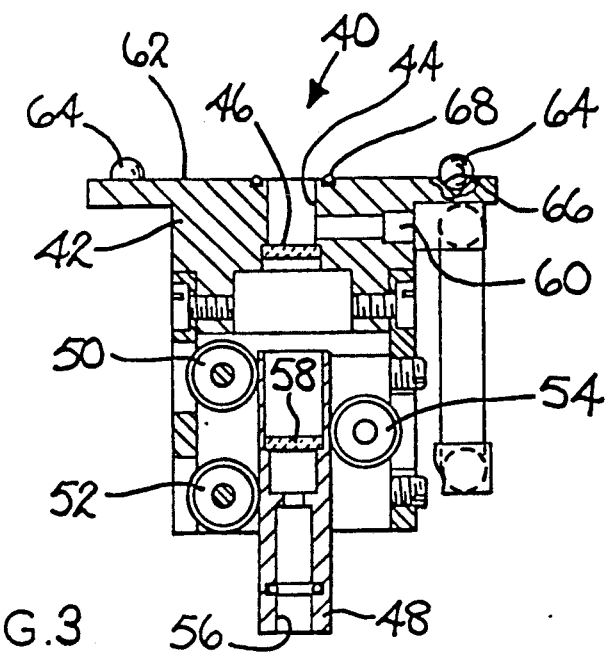
FIG. 3 is a view in section, in enlarged scale, of the tool holder in detail.

As is shown in more detail in FIG. 3, a tool holder (40) comprises magnetic body (42). The tool holder (40) is provided with a central bore (44) in which a glass plate (46) is located. A tool (48) is located for vertical movement within the tool holder (40), and is guided by grooved bearings (50,52,54). The tool (48) is provided with a central bore (56) in which a second glass plate (58) is located.

An air or vacuum connection (60) is provided in the side wall of the tool holder (40), close to its upper surface (62).

Precise location of the tool holder (40) on the head assembly (10) is achieved by means of a three-point location system. Three spheres (64) are mounted, equiangularly spaced, in the upper surface (62) of the tool holder (40), in recesses (66) machined close to the outer edge of the upper surface. Three matching location points are provided on the lower surface of the head (14), spaced to mate with the spheres (64) when the tool holder (40) is received on the head (14).

The first of these three location points is a concave surface, which determines the x-y position of the tool holder (40) relative to the head (14); the second is a flat surface which determines the height of the tool holder relative to the head and the third is a triangular prism which determines the angular rotation of the tool holder relative to the head. Thus in a simple manner, using a three point positioning system, the x-y position; angular rotation and height of the tool holder relative to the head can be precisely determined, reproducible to an accuracy of a few microns.

In operation, the head assembly (10) is driven to a tool bank, which has itself been indexed to locate a selected tool holder (40) at the pick-up station. The head (14) then picks up the tool holder (40) from the tool bank by means of the solenoid (28). A seal between the head (14) and tool holder (40) is provided by an O-ring (68) provided on the upper surface (62) of the tool holder (40). Precise orientation and location of the tool holder is ensured by the three-point system comprising the spheres (64) and matching location points.

The head assembly, including the tool holder, is then driven to the die eject station (104) of the hybrid die bonder where it is supplied with a semiconductor die by a die eject system as described and claimed in our copending U.S. patent application Ser. No. 661,916, filed on Feb. 27, 1991. The die is held onto the tool by suction, the tool being evacuated by means of the air-vacuum connection (60).

The complete head assembly is then driven to a mounting station where the die is bonded to a substrate. The photo cell (20) forms part of a light path control system where illumination is carried out through the glass plates (46,58) to ascertain whether or not a die is held on the tool (48). The tool holder is then rotated if necessary, by means of the stepping motor (26) and associated toothed belt (30).

The die is then appropriately mounted and the head assembly either returned to the die eject station, to pick up a firther similar die, or to the tool bank for tool exchange.

We claim:

1. A hybrid die bonder comprising
   a tool bank supporting a plurality of tool holders each including a tool defining a pick up axis and a magnetic body,
   a pick up head adapted to sequentially pick up said tool holders,
   said pick up head including magnetisable means so that a tool holder can be secured thereto,
   means for aligning said axis and preventing relative rotation about said axis when a tool holder is magnetically secured to said pick up head, and
   means for rotating said pick up head.

2. A hybrid die bonder according to claim 1, wherein said aligning and preventing means comprises three spheres secured to the top of said tool holder and three matching location points defined in the bottom of said pick up head.

3. A hybrid die bonder comprising
   a tool bank for releasably supporting a plurality of tool holders,
   a plurality of tool holders each including
      a magnetic body,
      said magnetic body having an upper surface including an air intake bore,
      a tool supported within said magnetic body for selected vertical displacement and having central vertical bore means for applying a vacuum to a component engaged by the tool to hold the component on the tool,
   a pick up head assembly for engaging any one of said tool holders including
      a rotatable magnetic housing,
      a solenoid within said housing,
      said housing having a lower surface including an air bore
   means for positioning one of said tool holders and said pick up head assembly in vertical alignment,
   means for locating said rotatable magnetic housing at an orientation selected to correspond to the orientation of a tool holder to be picked up,
   means for establishing a selected relationship between said upper and lower surfaces when a tool holder is picked up by said pick up head assembly, and
   means for sealingly connecting said housing air bore and said tool holder intake bore.

4. A hybrid die bonder according to claim 3, wherein said locating means comprises a stepping motor.

* * * * *